(12) United States Patent
Takami et al.

(10) Patent No.: US 9,929,017 B2
(45) Date of Patent: Mar. 27, 2018

(54) ETCHING METHOD USING HYDROGEN PEROXIDE SOLUTION CONTAINING TUNGSTEN

(71) Applicant: TOSHIBA MEMORY CORPORATION, Tokyo (JP)

(72) Inventors: Nagisa Takami, Mie (JP); Yoshihiro Uozumi, Aichi (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 561 days.

(21) Appl. No.: 13/788,216

(22) Filed: Mar. 7, 2013

(65) Prior Publication Data

US 2014/0073069 A1    Mar. 13, 2014

(30) Foreign Application Priority Data

Sep. 7, 2012  (JP) ................................. 2012-197021

(51) Int. Cl.
| H01L 21/306 | (2006.01) |
| H01L 21/66 | (2006.01) |
| H01L 21/02 | (2006.01) |
| H01L 21/3213 | (2006.01) |
| H01L 21/67 | (2006.01) |

(52) U.S. Cl.
CPC .. H01L 21/30604 (2013.01); H01L 21/02068 (2013.01); H01L 21/02087 (2013.01); H01L 21/32134 (2013.01); H01L 21/6708 (2013.01); H01L 22/10 (2013.01); H01L 2924/0002 (2013.01)

(58) Field of Classification Search
CPC ......... H01L 21/02019; H01L 21/02052; H01L 21/02054; H01L 21/02101; H01L 21/02021; H01L 21/02035; H01L 21/02087; H01L 21/0209; B08B 3/04–3/14
See application file for complete search history.

(56) References Cited

U.S. PATENT DOCUMENTS 5,899,738 A * 5/1999 Wu et al. ...................... 438/618
6,130,170 A   10/2000 David et al.
6,586,145 B2  7/2003 Yokoi et al.
(Continued)

FOREIGN PATENT DOCUMENTS

JP    11-162920    6/1999
JP    3172501     3/2001
(Continued)

OTHER PUBLICATIONS

Office Action dated Jan. 27, 2015, in corresponding Japanese Patent Application No. 2012-197021 (with English-language Translation).
(Continued)

*Primary Examiner* — Brigitte Paterson
(74) *Attorney, Agent, or Firm* — Oblon, McClelland, Maier & Neustadt, L.L.P.

(57) ABSTRACT

An etching method according to an embodiment, includes performing etching on a material having tungsten (W) as a main component by using as an etchant a chemical solution having hydrogen peroxide as a main component. The chemical solution contains 12 ppm or more and 100,000 ppm or less of W.

20 Claims, 4 Drawing Sheets

(56) References Cited

U.S. PATENT DOCUMENTS

| | | | |
|---|---|---|---|
| 2002/0127864 A1* | 9/2002 | Smith et al. | 438/692 |
| 2004/0140287 A1* | 7/2004 | Bogart et al. | 216/2 |
| 2011/0056913 A1* | 3/2011 | Mayer et al. | 216/84 |

FOREIGN PATENT DOCUMENTS

| | | |
|---|---|---|
| JP | 2003-17465 | 1/2003 |
| JP | 2004-31791 | 1/2004 |
| JP | 2004-103768 | 4/2004 |
| JP | 2006-210778 | 8/2006 |
| JP | 4551229 | 7/2010 |
| JP | 2011-066235 | 3/2011 |

OTHER PUBLICATIONS

Office Action dated Jul. 7, 2015 in Japanese Patent Application No. 2012-197021 (with English language translation).

* cited by examiner

ETCHING METHOD USING HYDROGEN PEROXIDE SOLUTION CONTAINING TUNGSTEN

CROSS-REFERENCE TO RELATED APPLICATION

This application is based upon and claims the benefit of priority from Japanese Patent Application No. 2012-197021 filed on Sep. 7, 2012 in Japan, the entire contents of which are incorporated herein by reference.

FIELD

Embodiments described herein generally relate to an etching method, an etching apparatus, and a chemical solution.

BACKGROUND

Tungsten (W) is used as a gate material or a wire material for semiconductor products. However, tungsten at an unnecessary portion on a semiconductor substrate needs to be removed. Particularly, tungsten deposited on back side of a substrate or so-called bevel portion as a region in the range between an outer circumferential edge of the substrate and a few millimeters from the outer circumferential edge could cause contamination in subsequent processes or lead to unstable processes. Thus, it is desirable to completely remove tungsten at the unnecessary portion.

A chemical solution is dispensed to a bevel portion of a substrate while, for example, the substrate being rotated on a rotating stage. Tungsten deposited on the bevel portion is thereby etched by the chemical solution. A chemical solution containing hydrogen peroxide is known as an etchant of tungsten. From the viewpoint of improving productivity of a semiconductor device, the development of a chemical solution having a tungsten etching rate faster than that of the current chemical solution is desired.

DETAILED DESCRIPTION

An etching method according to an embodiment, includes performing etching on a material having tungsten (W) as a main component by using as an etchant a chemical solution having hydrogen peroxide as a main component, the chemical solution containing 12 ppm or more and 100,000 ppm or less of W.

First Embodiment

The first embodiment will be described below by using the drawings.

Figure 1:
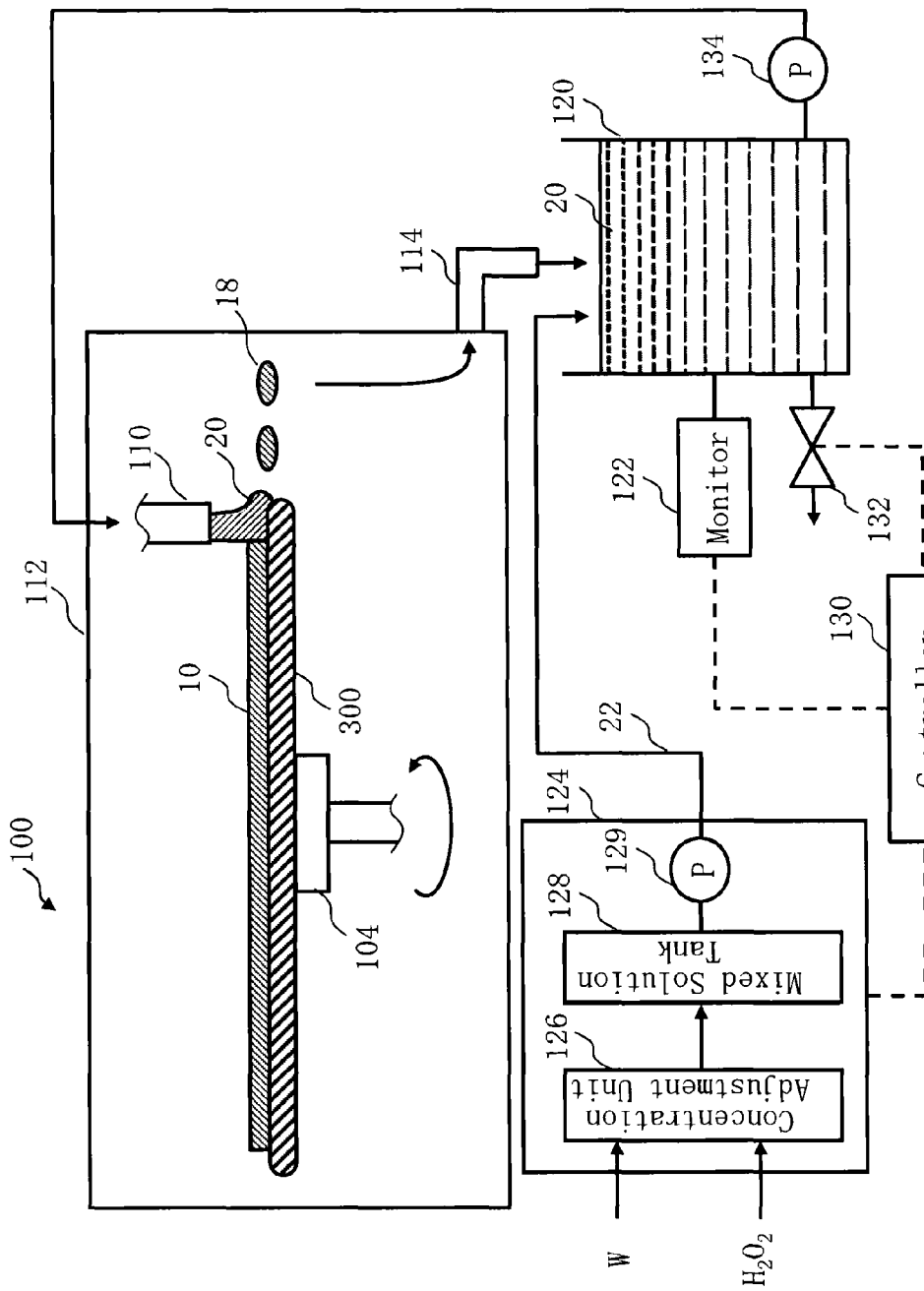
FIG. 1 is a diagram showing a configuration of an etching apparatus according to the first embodiment.

FIG. 1 is a diagram showing a configuration of an etching apparatus according to the first embodiment. In FIG. 1, an etching apparatus 100 according to the first embodiment includes a treatment chamber 112, a stage 104 to hold a substrate, a supply nozzle 110, a drain channel 114, a tank 120 for supplying a chemical solution, a measuring monitor 122, a concentration adjustment solution supply unit 124, a controller 130, a valve 132, and a pump 134. The stage 104 is rotatably arranged inside the treatment chamber 112. First, a substrate 300 such as a semiconductor substrate having a tungsten (W) film 10 formed at least on a front side is placed on the stage 104. The stage 104 chucks (holds) the back side of the substrate 300 by, for example, vacuum adsorption in the center of the back side of the substrate 300. In this case, the substrate 300 is placed in such a way that the center point on the front side of the substrate 300 is on the rotation axis of the stage 104.

A chemical solution 20 containing a hydrogen peroxide ($H_2O_2$) solution as a main component is stored in the tank 120. The chemical solution 20 is adjusted so that 12 ppm or more of tungsten (W) is contained. For the adjustment, the concentration of W in the chemical solution 20 inside the tank 120 is measured and monitored by the measuring monitor 122. Then, concentration information of the monitored W is output to the controller 130. As the measuring monitor 122, for example, the W concentration in the hydrogen peroxide solution is suitably observed by using ICP-MS or a spectrophotometer. The concentration of W may be measured at all times or at predetermined intervals. Then, the controller 130 calculates the quantity of W and the quantity of hydrogen peroxide solution to be supplied so that the concentration of W in the chemical solution 20 becomes 12 ppm or more and 100,000 ppm or less. Then, the controller 130 outputs calculation results to the concentration adjustment solution supply unit 124.

In the concentration adjustment solution supply unit 124 (example of the supply unit), a concentration adjustment unit 126 mixes required W and hydrogen peroxide whose quantities are calculated with input information from the controller 130. For example, a mixed solution for concentration adjustment may be produced by arranging solid W inside the concentration adjustment unit 126, supplying a suitable volume of hydrogen peroxide solution, and dissolving required quantity of W calculated with input information from the controller 130 in the hydrogen peroxide solution. The produced mixed solution is temporarily stored in a mixed solution tank 128. A mixed solution 22 (concentration adjustment solution) in the mixed solution tank 128 is sent out from inside the concentration adjustment solution supply unit 124 by a pump 129 before being supplied to the tank 120.

In the treatment chamber 112, a chemical solution inside the tank 120 whose concentration of tungsten is adjusted to 12 ppm or more and 100,000 ppm or less is used as an etchant for etching processes of a material whose main component is W. A concrete description will be provided below as an example.

In a substrate rotation process, the substrate 300 whose center is placed on the axis is rotated by rotating the stage 104 around the stage center as the axis while the center on the back side of the substrate 300 is chucked (held) to the front side of the stage 104. The number of revolutions is suitably controlled to, for example, 300 to 1500 $\text{min}^{-1}$ (rpm).

In a chemical solution supply process, the chemical solution 20 is supplied by sending out the chemical solution 20 inside the tank 120 onto at least the bevel portion of the substrate 300 by the pump 134. More specifically, the chemical solution 20 is sent out toward the nozzle 110 from the tank 120 filled with the chemical solution 20 having at least hydrogen peroxide as a main component and containing 12 ppm or more and 100,000 ppm or less of W to supply the chemical solution 20 to the bevel portion on the front side of the substrate 300 from the nozzle 110 arranged above the bevel portion of the substrate 300. The bevel portion indicates a region, for example, up to a few millimeters from the substrate edge (for example, 0 to 5 mm).

With the above operation, the chemical solution 20 supplied to the bevel portion of the substrate 300 as an etchant flows to the edge of the substrate 300 due to a centrifugal force while etching the W film 10 at the bevel portion of the substrate 300 before flying away from the edge of the substrate 300. Used chemical solution 18 that has flied away is drained from the drain channel 114 arranged below the treatment chamber 112 through walls inside the treatment chamber 112. The drained chemical solution 18 is returned to the tank 120. Thus, the chemical solution in the tank 120 is used for etching processes and then, returned to the tank 120. Then, in the tank 120, the w concentration is adjusted as described above and the adjusted chemical solution 20 is supplied for etching again. Thus, the chemical solution 18 used for etching is suitably circulated to be used for etching again.

Figure 2A:
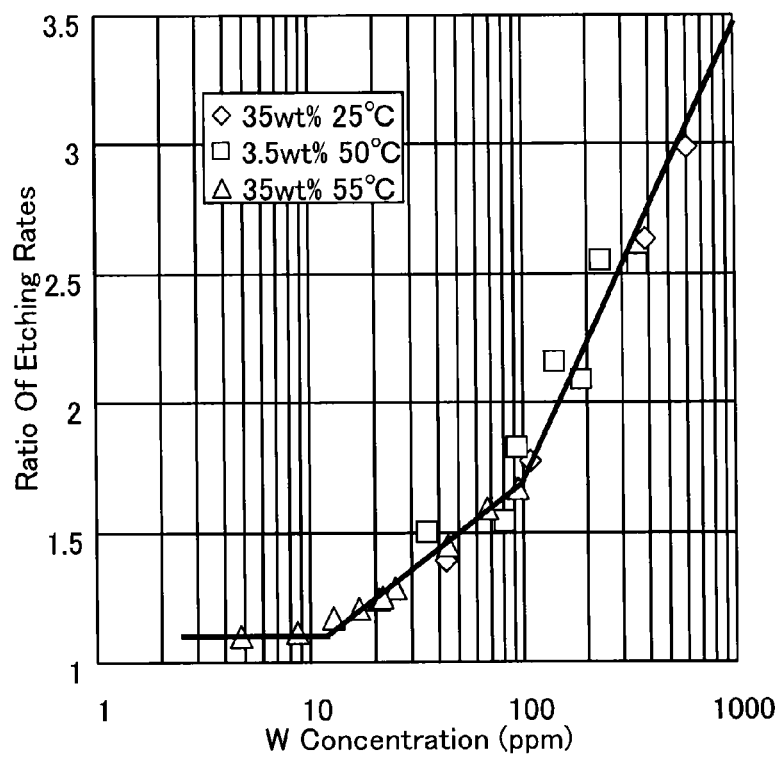
FIGS. 2A and 2B are diagrams exemplifying the relationship between tungsten concentration and a ratio of the etching rate of a hydrogen peroxide solution containing tungsten to the etching rate of a hydrogen peroxide solution containing no tungsten in the first embodiment.
Figure 2B:
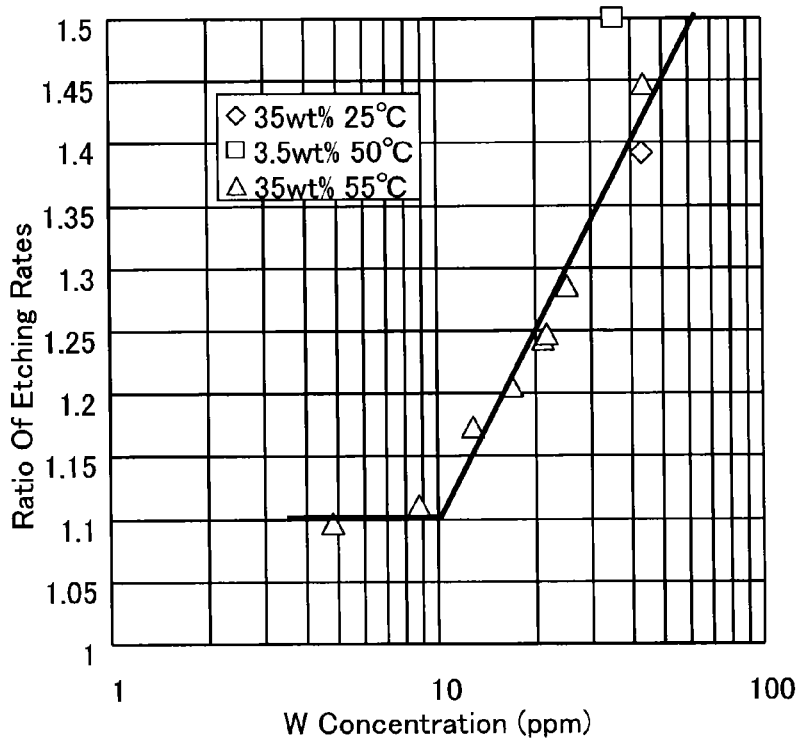

FIGS. 2A and 2B are diagrams exemplifying the relationship between tungsten concentration and a ratio of the etching rate with a hydrogen peroxide solution containing tungsten to the etching rate with a hydrogen peroxide solution containing no tungsten in the first embodiment. FIG. 2A shows results in the range from 1 ppm to 1000 ppm the tungsten concentration in the hydrogen peroxide solution and FIG. 2B shows results when the tungsten concentration is changed up to 100 ppm. Here, etching processes of tungsten films are performed by making the tungsten concentration variable in 35 wt % hydrogen peroxide solution held at 25° C., 3.5 wt % hydrogen peroxide solution heated to 50° C., and 35 wt % hydrogen peroxide solution further heated to 55° C.

Etching processes are performed by soaking the tungsten films in chemical solutions. The tungsten films are soaked in chemical solutions and taken out of the solutions after predetermined time as the etching time and the quantities of tungsten those have been decreased by etching are measured to determine the etching rates from the decreased quantities of tungsten and the etching time. It is clear from FIGS. 2A and 2B that the ratio of the tungsten etching rate with a tungsten containing hydrogen peroxide solution to the etching rate of tungsten with a hydrogen peroxide solution containing no tungsten depends on the concentration of contained tungsten independent of the temperature and concentration of the hydrogen peroxide solution. In FIG. 2B, when the tungsten concentration is less than 10 ppm, there is practically no change of the etching rate with respect to the etching rate when no tungsten is contained, but when the tungsten concentration exceeds 10 ppm to reach 12 ppm, the etching rate begins to rise, resulting in a clear rise in etching rate when the tungsten concentration is 15 ppm or more. As the tungsten concentration rises to 20 ppm and 25 ppm, the etching rate also rises. When the tungsten concentration is further increased, the rise in etching rate becomes more steep near 100 ppm (FIG. 2A).

At this point, the etching rate of tungsten in the 35 wt % hydrogen peroxide solution heated to 55° C. whose tungsten concentration is 0%, that is, containing no tungsten is about 55 nm/min. In contrast, the etching rate rises with an increasing tungsten concentration like about 63 nm/min in the tungsten concentration of 12 ppm, about 66 nm/min in the tungsten concentration of 15 ppm, and about 68 nm/min in the tungsten concentration of 20 ppm. The etching rate further rises like about 78 nm/min in the tungsten concentration of 40 ppm and 90 nm/min in the tungsten concentration of 95 ppm. Similarly, the etching rate of tungsten in the 3.5 wt % hydrogen peroxide solution held at 50° C. whose tungsten concentration is 0%, that is, containing no tungsten is about 35 nm/min. In contrast, the etching rate rises like about 52 nm/min in the tungsten concentration of 35 ppm and about 63 nm/min in the tungsten concentration of 100 ppm. Further, the etching rate sharply rises like 75 nm/min in the tungsten concentration of 150 ppm and 88 nm/min in the tungsten concentration of 350 ppm. Further similarly, the etching rate of tungsten in the 35 wt % hydrogen peroxide solution held at 25° C. whose tungsten concentration is 0%, that is, containing no tungsten is about 9.5 nm/min. In contrast, the etching rate rises like about 13 nm/min in the tungsten concentration of 40 ppm and about 13 nm/min in the tungsten concentration of 100 ppm. Further, the etching rate sharply rises like 25 nm/min in the tungsten concentration of 400 ppm and 28 nm/min in the tungsten concentration of 600 ppm and tends to rise still further when the tungsten concentration is more than 600 ppm.

As will be described later, if the W concentration increases too much, the etching rate falls. The W concentration in which the etching rate is smaller than the etching rate when no W is contained is approximate 100,000 ppm.

From the above result, it is clear that when the W film is etched, a singular point of the etching rate is present near 12 ppm of the W concentration in a hydrogen peroxide solution regardless of the temperature and concentration. In other words, it is clear that when a material having at least W as a main component is etched, the etching rate can be caused to rise sharply by containing W in the range of 12 ppm or more, more desirably 15 ppm or more, and still more desirably 20 ppm or more and 100,000 ppm or less in a hydrogen peroxide solution regardless of the temperature and concentration. If the W concentration is less 10 ppm, the etching rate is substantially no different from the etching rate when no W is contained and no singular point where the etching rate rises sharply is found. To achieve an improvement in etching rate effective in production of actual semiconductor devices, like the present embodiment, W may be contained in the range of 12 ppm or more, more desirably 15 ppm or more, and still more desirably 20 ppm or more and 100,000 ppm or less.

The mechanism of the rise in etching rate will be considered here. The reaction of W and hydrogen peroxide is represented by the following reaction formulas. First, the reaction of hydrogen peroxide can be represented by the following reaction formula (1):

$$H_2O_2 + 2H^+ + 2e^- \Leftrightarrow 2H_2O \quad (1)$$

The reaction of W can be represented by the following reaction formula (2):

$$W + 4H_2O \Leftrightarrow WO_4^{2-} + 8H^+ + 3H_2O \quad (2)$$

Then, the reaction formula (1) and the reaction formula (2) can be organized into the following reaction formula (3):

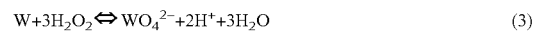
$$W + 3H_2O_2 \Leftrightarrow WO_4^{2-} + 2H^+ + 3H_2O \quad (3)$$

Figure 3:
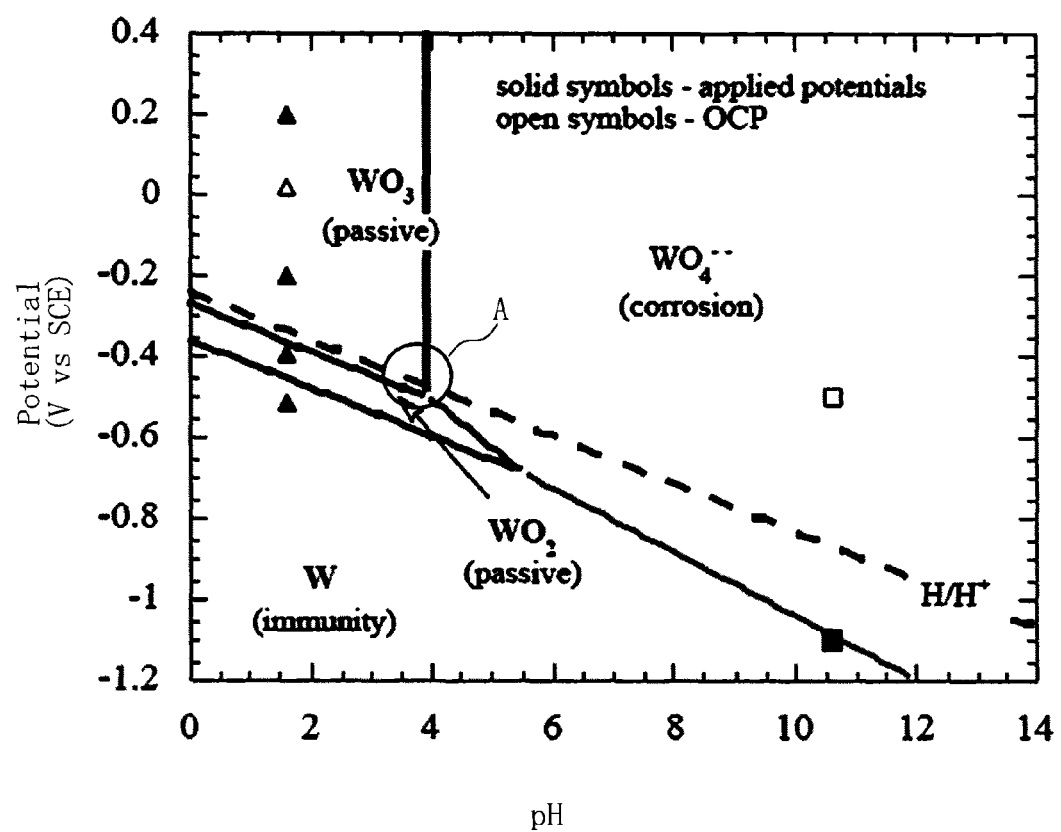
FIG. 3 is a diagram showing the relationship between an oxidation reduction potential of tungsten and pH to describe the mechanism of the first embodiment.

FIG. 3 is a diagram showing the relationship for tungsten between oxidation reduction potential and pH to describe the mechanism of the first embodiment. In FIG. 3, when W is etched by a hydrogen peroxide solution, as shown in the reaction formula (3), W is dissolved as $WO_4^{2-}$ (ion tungstate). At the same time, $H^+$ (hydrogen ion) increases with the reaction and pH of the solution gradually decreases with the generation of $H^+$ (hydrogen ion). Thus, when 12 ppm or more of W is dissolved, the forward reaction of the reaction formula (1) is accelerated and, as a result, the forward reaction of the reaction formula (3) is accelerated. Accordingly, a rise in etching rate is expected. However, if the concentration of dissolved W further increases, $H^+$ (hydrogen ion) further increases, leading to a significant drop in pH. If, as shown in FIG. 3, pH drops and the boundary indicated by A is exceeded, a region of $WO_3$ (passive state) is entered. The reaction in $WO_3$ (passive state) is represented by the following reaction formula (4):

$$WO_3 + H_2O \Leftrightarrow WO_4^{2-} + 2H+ \quad (4)$$

If $H^+$ (hydrogen ion) increases with an increasing concentration of dissolved W, pH drops significantly. Thus, the reverse reaction of the reaction formula (4) is considered to be accelerated to become $WO_3$ (passive state), leading to a lower etching rate. Thus, the etching rate is expected to drop if the W concentration contained in the hydrogen peroxide solution increases too much, but in the range up to 600 ppm in which an experiment was performed, no drop in etching rate was observed. Therefore, in the W concentration of 12 ppm or more and at least up to 600 ppm, the etching rate can be caused to rise dramatically.

When, for example, etching processes of the W film 10 are performed, the quantity of dissolved W may be calculated from the number of processed substrates and/or processed time to estimate the proper quantity of added hydrogen peroxide solution by the controller 130 when a W concentration that causes the etching rate to drop is reached. The concentration may also be controlled by adding the quantity of hydrogen peroxide solution estimated for each etching process to keep the etching rate of tungsten (W) high and/or stable. If the quantity of the chemical solution 20 in the tank 120 increases excessively, an unnecessary quantity of the chemical solution may be drained through the valve 132.

Because, as is shown in the reaction formula (3), pH can be caused to drop by dissolved W in a hydrogen peroxide solution, a similar effect can also be expected when a material other than tungsten is etched. Concrete materials include beryllium, aluminum, gallium, indium, zirconium, chromium, iron, molybdenum, germanium, zinc, vanadium, hafnium, magnesium, mercury, selenium, tellurium, copper, arsenic, bismuth, antimony, rhenium, nickel, cobalt, and cadmium.

Therefore, a similar effect can be obtained, not to be limited to the example of etching the W film 10 described above, when a material containing one or two or more of tungsten, beryllium, aluminum, gallium, indium, zirconium, chromium, iron, molybdenum, germanium, zinc, vanadium, hafnium, magnesium, mercury, selenium, tellurium, copper, arsenic, bismuth, antimony, rhenium, nickel, cobalt, and cadmium is etched.

In the above example, the concentration of W in the chemical solution 20 inside the tank 120 is directly measured and monitored by the measuring monitor 122, but the present embodiment is not limited to such an example. As shown in FIG. 3, a chemical solution with high etching rate can also be maintained by managing pH. pH is lowered by dissolving W in a hydrogen peroxide solution and thus, the W concentration can indirectly be measured and monitored by the measured pH. Thus, if pH approaches a threshold, the concentration of W may be adjusted by supplying a hydrogen peroxide solution to the tank 120.

In such a case, pH of the chemical solution 20 inside the tank 120 may be measured and monitored by the measuring monitor 122. The chemical solution 20 is adjusted so that, for example, pH is 4.0 or more. In such a case, monitored pH information is output to the controller 130. pH may be measured at all times or at predetermined intervals. Then, the controller 130 calculates the quantity of W and the quantity of hydrogen peroxide solution to be supplied so that pH of the chemical solution 20 becomes 4.0 or more. Then, the controller 130 outputs calculation results to the concentration adjustment solution supply unit 124.

In the concentration adjustment solution supply unit 124 (example of the supply unit), W and a hydrogen peroxide solution those are to be supplied are mixed by the concentration adjustment unit 126 based on information of each quantities input from the controller 130. Alternatively, only a hydrogen peroxide solution is prepared. The produced mixed solution or the hydrogen peroxide solution is temporarily stored in the mixed solution tank 128. The mixed solution 22 or the hydrogen peroxide solution (concentration adjustment solution) in the mixed solution tank 128 is sent out from inside the concentration adjustment solution supply unit 124 by the pump 129 before being supplied to the tank 120. Also with the above configuration, pH that does not cause the etching rate to fall can be maintained while the W concentration suitable for improving the etching rate being maintained.

According to the first embodiment, as described above, an etching method and an etching apparatus that improve the etching rate and a chemical solution used for such etching can be obtained. Therefore, productivity can be enhanced by improving throughput of etching processes.

Second Embodiment

In the first embodiment, as shown in FIG. 1, an example in which a W film in a bevel portion on the front side of a substrate is etched is shown, but the present disclosure is not limited to such an example.

Figure 4:
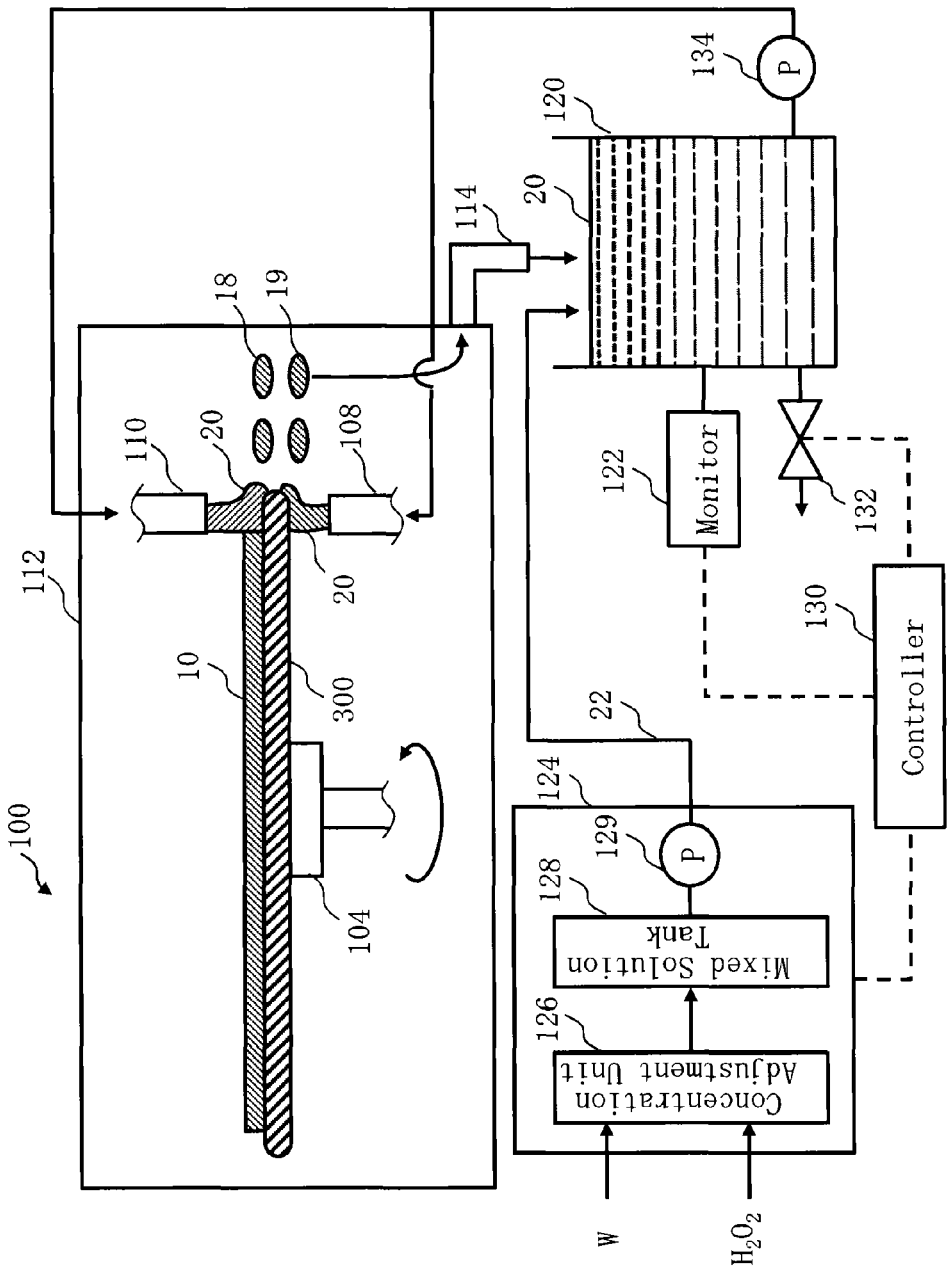
FIG. 4 is a diagram showing a configuration of an etching apparatus according to the second embodiment.

FIG. 4 is a diagram showing the configuration of the etching apparatus according to the second embodiment. FIG. 4 is the same as FIG. 1 except that a supply nozzle 108 and a pipe (not shown) from the tank 120 to the supply nozzle 108 are added. Content not specifically mentioned below is the same as in the first embodiment.

As a chemical solution supply process, when the chemical solution 20 is supplied from the nozzle 110 (first supply nozzle) arranged above the bevel portion of the substrate 300 to the bevel portion on the front side of the substrate 300, the chemical solution 20 is supplied from the nozzle 108 (second supply nozzle) arranged below the bevel portion of the substrate 300 to the bevel portion on the back side of the substrate 300 at the same time.

With the above operation, the W film 10 formed in the bevel portion on the front side of the substrate 300 is etched and at the same time, the W film attached to the bevel portion on the back side of the substrate 300 is etched. A used chemical solution 19 supplied from the back side of the substrate 300 and flied away from the edge on the back side of the substrate is drained, like the chemical solution 18, from the drain channel 114 arranged below the treatment chamber 112 through walls inside the treatment chamber 112. The drained chemical solutions 18 and 19 are returned to the tank 120. Thus, the chemical solution in the tank 120 is used for etching processes and then, returned to the tank 120. Then, in the tank 120, the W concentration is adjusted as described above and the adjusted chemical solution 20 is supplied for etching again. Thus, the chemical solutions 18 and 19 used for etching are suitably circulated to be used for etching again.

According to the second embodiment, as described above, a material such as W attached to the back side of a substrate can be etched at higher etching rate than in the past.

In the foregoing, embodiments have been described with reference to concrete examples. However, the present disclosure is not limited to such concrete examples. In FIG. 4, for example, the back side of the substrate is held, but edges of the substrate may be held. Also, a chemical solution is supplied to the bevel portion on the front side and/or the back side of the substrate, but a chemical solution may also be supplied to the center on the front side and/or the back side of the substrate. Accordingly, the material such as W attached in a wide region on the front side and/or the back side of the substrate can be removed. Further, the material such as W in the bevel portion on the front side of the substrate can be removed by causing a chemical solution supplied to the back side of the substrate to move to the front side of the substrate. In this case, a chemical solution may not have to be supplied to the bevel portion on the front side of the substrate.

Concerning the thickness, size, and shape of a film on the substrate, what is needed for semiconductor integrated circuits or various semiconductor elements can be selected and used as appropriate.

In addition, all etching methods, etching apparatuses, and chemical solutions which include the elements of the present disclosure and can be obtained by arbitrary change of design by a person skilled in the art are included in the spirit and scope of the disclosure.

While techniques normally used in the semiconductor industry such as cleaning before and after treatment are not described for convenience of description, it is needless to say that such techniques are included in the scope of the present disclosure.

While certain embodiments have been described, these embodiments have been presented by way of example only, and are not intended to limit the scope of the inventions. Indeed, the novel methods and devices (or apparatuses) described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. An etching method, comprising:
performing etching on a material having tungsten (W) as a main component by applying as an etchant a chemical solution comprising hydrogen peroxide as a main component to said material, the chemical solution further comprising 12 ppm or more and 100,000 ppm or less of W,
wherein said process provides an etching rate of said material having tungsten as a main component that is faster than an etching rate provided by an otherwise identical chemical solution not comprising tungsten.

2. The method according to claim 1, wherein chemical solution having been used for the etching is circulated to be used for the etching again.

3. The method according to claim 1, wherein the material to be etched is formed in a bevel portion of a semiconductor substrate.

4. The method according to claim 3, wherein the chemical solution is supplied to the bevel portion.

5. The method according to claim 4, wherein the chemical solution is supplied to the bevel portion on a front surface of the semiconductor substrate.

6. The method according to claim 4, wherein the chemical solution is supplied to a back surface of the semiconductor substrate.

7. The method according to claim 4, wherein the chemical solution is supplied to the bevel portion on a front surface of the semiconductor substrate and a back surface of the semiconductor substrate at a same time.

8. The method according to claim 1, wherein a film of the material is formed on an entire surface of a front surface of a semiconductor substrate.

9. The method according to claim 8, wherein a W film is the film.

10. The method according to claim 1, further comprising: measuring a concentration of the W in the chemical solution directly or indirectly before performing etching.

11. The method according to claim 1, further comprising: supplying a solution containing hydrogen peroxide with or without W into a tank storing the chemical solution to adjust the concentration of W in the chemical solution to 12 ppm or more and 100,000 ppm or less before performing etching.

12. The method according to claim 11, wherein a mixed solution is produced by supplying the solution containing hydrogen peroxide to solid W to dissolve the W by the solution containing hydrogen peroxide.

13. The method according to claim 1, wherein chemical solution having been used for the etching is returned into a tank storing the chemical solution before being used for the etching and the concentration of W in the chemical solution is adjusted to 12 ppm or more and 100,000 ppm or less before being used for the etching again.

14. The method according to claim 13, wherein a chemical solution having been supplied to a bevel portion on a front surface of a semiconductor substrate is the chemical solution having been used for the etching.

15. The method according to claim 13, wherein a chemical solution having been supplied to a back surface of a semiconductor substrate is the chemical solution having been used for the etching.

16. The method according to claim 13, wherein both of a chemical solution having been supplied to a bevel portion on a front surface of a semiconductor substrate and a chemical solution having been supplied to a back surface of the semiconductor substrate are the chemical solution having been used for the etching.

17. The method according to claim 1, wherein the chemical solution comprises 15 ppm or more and 100,000 ppm or less of W.

18. The method according to claim 1, wherein the chemical solution comprises 20 ppm or more and 100,000 ppm or less of W.

19. The method according to claim 1, wherein the chemical solution comprises 12 ppm or more and 600 ppm or less of W.

20. The method according to claim 1, wherein the chemical solution comprises 150 ppm or more and 100,000 ppm or less of W.

* * * * *